(12) United States Patent
Qian et al.

(10) Patent No.: US 11,004,417 B2
(45) Date of Patent: May 11, 2021

(54) SHIFT REGISTER UNIT AND DRIVING METHOD THEREOF, DRIVING APPARATUS AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Xianrui Qian, Beijing (CN); Yuting Chen, Beijing (CN); Zixuan Wang, Beijing (CN); Donghui Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 122 days.

(21) Appl. No.: 16/389,152

(22) Filed: Apr. 19, 2019

(65) Prior Publication Data

US 2019/0325836 A1 Oct. 24, 2019

(30) Foreign Application Priority Data

Apr. 24, 2018 (CN) .......................... 201810373776.6

(51) Int. Cl.
*G11C 19/00* (2006.01)
*G09G 3/36* (2006.01)
(Continued)

(52) U.S. Cl.
CPC ............ *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 9,875,706 B1 1/2018 Gong
2008/0101529 A1* 5/2008 Tobita .................. G09G 3/3677
377/64
(Continued)

FOREIGN PATENT DOCUMENTS

CN 105096904 A 11/2015
CN 106128347 A 11/2016
(Continued)

OTHER PUBLICATIONS

Mar. 2, 2020—(CN) First Office Action Appn 201810373776.6 with English Translation.

*Primary Examiner* — Tuan T Lam
(74) *Attorney, Agent, or Firm* — Banner & Witcoff, Ltd.

(57) ABSTRACT

There is provided in the present disclosure a shift register unit, including: a pull-up control circuit, connected to a signal input terminal and a pull-up node; a pull-up circuit, connected to the pull-up node, a first clock signal terminal and a signal output terminal; a pull-down circuit, connected to a pull-down node, the pull-up node, the signal output terminal and a power supply voltage terminal, and configured to pull down voltages of the pull-up node and the signal output terminal to a voltage of the power supply voltage terminal under the control of the pull-down node; a first pull-down control circuit, connected to a second clock signal terminal, a pull-down control signal terminal, the pull-down node and the power supply voltage terminal, and configured to pull up the voltage of the pull-down node to a valid pull-down level under the control of the pull-down control signal terminal.

18 Claims, 5 Drawing Sheets

(51) Int. Cl.
    *G11C 19/28*     (2006.01)
    *G09G 3/20*     (2006.01)

(52) U.S. Cl.
    CPC . *G09G 2310/0286* (2013.01); *G09G 2310/08* (2013.01)

(56) References Cited

U.S. PATENT DOCUMENTS

| | | | |
|---|---|---|---|
| 2008/0219401 A1* | 9/2008 | Tobita | G09G 3/3677 377/79 |
| 2011/0058640 A1* | 3/2011 | Shang | G11C 19/184 377/64 |
| 2012/0262438 A1* | 10/2012 | Shang | G11C 19/28 345/211 |
| 2014/0111413 A1* | 4/2014 | Chen | G11C 19/28 345/100 |
| 2016/0125954 A1* | 5/2016 | Gu | G11C 19/28 377/64 |
| 2016/0314850 A1* | 10/2016 | Gu | G11C 19/28 |
| 2016/0314851 A1 | 10/2016 | Amano et al. | |
| 2018/0293924 A1 | 10/2018 | Wang | |
| 2018/0350315 A1 | 12/2018 | Zhang et al. | |
| 2019/0096350 A1 | 3/2019 | Zhao et al. | |
| 2019/0139616 A1* | 5/2019 | Qian | G11C 19/28 |
| 2019/0214104 A1* | 7/2019 | Qian | G11C 19/28 |
| 2019/0311667 A1* | 10/2019 | Qian | G11C 19/28 |
| 2020/0027515 A1* | 1/2020 | Gu | G09G 3/20 |
| 2020/0051655 A1* | 2/2020 | Dong | G09G 3/20 |
| 2020/0058362 A1* | 2/2020 | Xu | G11C 19/28 |

FOREIGN PATENT DOCUMENTS

| | | |
|---|---|---|
| CN | 106356015 A | 1/2017 |
| CN | 107705762 A | 2/2018 |

\* cited by examiner

SHIFT REGISTER UNIT AND DRIVING METHOD THEREOF, DRIVING APPARATUS AND DISPLAY APPARATUS

CROSS-REFERENCE TO RELATED APPLICATION

The present application claims priority of Chinese Patent Application No. 201810373776.6 filed on Apr. 24, 2018, the disclosure of which is incorporated herein by reference in its entirety as part of the present application.

TECHNICAL FIELD

The present disclosure relates to a gate driving circuit, in particular to a shift register unit and a driving method thereof, a driving apparatus and a display apparatus.

BACKGROUND

A liquid crystal display panel is composed of vertical and horizontal array pixel matrixes. In the process of displaying, a gate scanning signal is outputted through a gate driving circuit, and respective pixels are scanned and accessed progressively. The gate driving circuit is used to produce gate scanning voltages of pixels. Gate On Array (GOA) is a technique of integrating the gate driving circuit on a thin film transistor substrate. As a shift register unit, each GOA unit delivers scanning signals to a next GOA unit sequentially, to progressively start the switches of the thin film transistor, and thus complete data signal input of pixel units. Compared with a conventional IC driving mode, the GOA driving has advantages of low cost and few processes and so on.

On the other hand, as panel display develops, high resolution and narrow framework becomes a development trend. With respect to this trend, the GOA technique directly integrates and manufactures a TF-LCD gate driving circuit on an array substrate, thereby taking place of a driving chip which is made of a silicon chip and adhered to the outside edge of the panel. Since the technique can manufacture the driving circuit on the array substrate directly, it is unnecessary to adhere IC and arrange wirings around the panel, which reduces the manufacturing procedure of the panel, reduces the cost of products, and at the same time raises integrity of the TFT-LCD panel, so that the display panel is more advantageous to satisfy the requirement for narrow framework and high resolution.

SUMMARY

According to one aspect of the present disclosure, there is provided a shift register unit, comprising: a pull-up control circuit, connected to a signal input terminal and a pull-up node, and configured to output a voltage of the signal input terminal to the pull-up node under the control of the signal input terminal; a pull-up circuit, connected to the pull-up node, a first clock signal terminal and a signal output terminal, and configured to output a first clock signal of the first clock signal terminal to the signal output terminal under the control of the pull-up node; a pull-down circuit, connected to a pull-down node, the pull-up node, the signal output terminal and a power supply voltage terminal, and configured to pull down voltages of the pull-up node and the signal output terminal to a voltage of the power supply voltage terminal under the control of the pull-down node; a first pull-down control circuit, connected to a second clock signal terminal, a pull-down control signal terminal, the pull-down node and the power supply voltage terminal, and configured to pull up the voltage of the pull-down node to a valid pull-down level under the control of the pull-down control signal terminal.

According to the embodiments of the present disclosure, the first pull-down control circuit comprises: a first pull-down control transistor, of which a gate is connected to the pull-down control signal terminal, a first electrode is connected to the second clock signal terminal, and a second electrode is connected to the pull-down node; a second pull-down control transistor, of which a gate is connected to the pull-down control signal terminal, a first electrode is connected to the pull-down node, and a second electrode is connected to the power supply voltage terminal.

According to the embodiments of the present disclosure, the voltage of the pull-down node is controlled according to a channel width-to-length ratio of the first pull-down control transistor and the second pull-down control transistor.

According to the embodiments of the present disclosure, the shift register unit further comprises a second pull-down control circuit, connected to the first clock signal terminal, the pull-up node, the pull-down node and the power supply voltage terminal, and configured to pull down the voltage of the pull-down node to a voltage of the power supply voltage terminal when the pull-up node is at a valid pull-up level, and make the pull-down node be at a valid pull-down level when the pull-up node is at an invalid pull-up level.

According to the embodiments of the present disclosure, the second pull-down control circuit comprises: a first capacitor, of which one terminal is connected to the first clock signal terminal, and another terminal is connected to the pull-down node; a third pull-down control transistor, of which a gate is connected to the pull-up node, a first electrode is connected to the pull-down node, and a second electrode is connected to the power supply voltage terminal.

The shift register unit according to the embodiments of the present disclosure further comprises an auxiliary noise reduction circuit, connected to the second clock signal terminal, the signal output terminal and the power supply voltage terminal, and configured to pull down the voltage of the signal output terminal to the voltage of the power supply voltage terminal under the control of the second clock signal terminal.

According to the embodiments of the present disclosure, the auxiliary noise reduction circuit comprises: an auxiliary noise reduction transistor, of which a gate is connected to the second clock signal terminal, a first electrode is connected to the signal output terminal, and a second electrode is connected to the power supply voltage terminal.

According to the embodiments of the present disclosure, the shift register unit further comprises a reset circuit, connected to the pull-up node, the signal output terminal, the power supply voltage terminal and a reset signal terminal, and configured to pull down voltages of the pull-up node and the signal output terminal to the voltage of the power supply voltage terminal under the control of the reset signal terminal.

According to the embodiments of the present disclosure, the reset circuit comprises: a first reset transistor, of which a gate is connected to the reset signal terminal, a first electrode is connected to the pull-up node, and a second electrode is connected to the power supply voltage terminal; a second reset transistor, of which a gate is connected to the reset signal terminal, a first electrode is connected to the signal output terminal, and a second electrode is connected to the power supply voltage terminal.

According to the embodiments of the present disclosure, the pull-up control circuit comprises: a pull-up control transistor, of which a gate and a first electrode are connected to the signal input terminal, and a second electrode is connected to the pull-up node; the pull-up circuit comprises: a pull-up transistor, of which a gate is connected to the pull-up node, a first electrode is connected to the first clock signal terminal, and a second electrode is connected to the signal output terminal, and a second capacitor, of which one terminal is connected to the pull-up node, and another terminal is connected to the signal output terminal; the pull-down circuit comprises: a first pull-down transistor, of which a gate is connected to the pull-down node, a first electrode is connected to the pull-up node, and a second electrode is connected to the power supply voltage terminal, and a second pull-down transistor, of which a gate is connected to the pull-down node, a first electrode is connected to the signal output terminal, and a second electrode is connected to the power supply voltage terminal.

According to the embodiments of the present disclosure, a first clock signal of the first clock signal terminal and a second clock signal of the second clock signal terminal have opposite phases.

According to another aspect of the present disclosure, there is provided a driving method for the shift register unit, comprising: outputting, by the pull-up control circuit, the voltage of the signal input terminal to the pull-up node when the voltage of the signal input terminal is at a valid level; outputting, by the pull-up circuit, the first clock signal of the first clock signal terminal to the signal output terminal when the pull-up node is at a valid pull-up level; pulling up, by the first pull-down control circuit, the voltage of the pull-down node to a valid pull-down level when the voltage of the pull-down control signal terminal is at a valid pull-down control level; pulling down, by the pull-down circuit, the voltages of the pull-up node and the signal output to the voltage of the power supply voltage terminal when the pull-down node is at a valid pull-down level.

According to the embodiments of the present disclosure, the first pull-down control circuit comprises: a first pull-down control transistor, of which a gate is connected to the pull-down control signal terminal, a first electrode is connected to the second clock signal terminal, and a second electrode is connected to the pull-down node; a second pull-down control transistor, of which a gate is connected to the pull-down control signal terminal, a first electrode is connected to the pull-down node, and a second electrode is connected to the power supply voltage terminal.

According to the embodiments of the present disclosure, the voltage of the pull-down node is controlled according to a channel width-to-length ratio of the first pull-down control transistor and the second pull-down control transistor.

The driving method according to the embodiments of the present disclosure further comprises: pulling down, by the second pull-down control circuit, the voltage of the pull-down voltage to the voltage of the power supply voltage terminal when the pull-up node is at a valid pull-up level; making, by the second pull-down control circuit, the pull-down node in a valid pull-down level when the pull-up node is at an invalid pull-up level.

According to the embodiments of the present disclosure, the second pull-down control circuit comprises: a first capacitor, of which one terminal is connected to the first clock signal terminal, and another terminal is connected to the pull-down node; a third pull-down control transistor, of which a gate is connected to the pull-up node, a first electrode is connected to the pull-down node, and a second electrode is connected to the power supply voltage terminal.

According to the embodiments of the present disclosure, the driving method further comprises: pulling down, by the auxiliary noise reduction circuit, the voltage of the signal output terminal to the voltage of the power supply voltage terminal when the second clock signal of the second clock signal terminal is at a first level, of which the first clock signal of the first clock signal terminal and the second clock signal of the second clock signal terminal have opposite phases.

According to the embodiments of the present disclosure, the driving method further comprises: pulling down, by the reset circuit, the voltages of the pull-up node and the signal output terminal to the voltage of the power supply voltage terminal when the voltage of the reset signal terminal is at a valid reset level.

According to another aspect of the present disclosure, there is provided a gate driving apparatus, comprising a plurality stages of shift register units connected in cascades, each stage shift register of the plurality stages of shift register units as described above, of which except for a last stage shift register unit, an output terminal of each stage shift register unit is connected to a signal input terminal of a next stage shift register unit adjacent thereto; a signal input terminal of a first stage shift register unit is inputted a frame start signal.

According to another aspect of the present disclosure, there is provided a display apparatus comprising the gate driving apparatus as described above.

BRIEF DESCRIPTION OF THE DRAWINGS

In order to describe technical solutions in embodiments of the present disclosure or in the prior art more clearly, accompanying figures that need to be used in descriptions of the embodiments or the prior art will be introduced below briefly. Obviously, the accompanying figures in the following description are just some embodiments of the present disclosure. For those ordinary skilled in the art, other figures can also be obtained from these figures, without paying any inventive labor.

DETAILED DESCRIPTION

Figure 1:
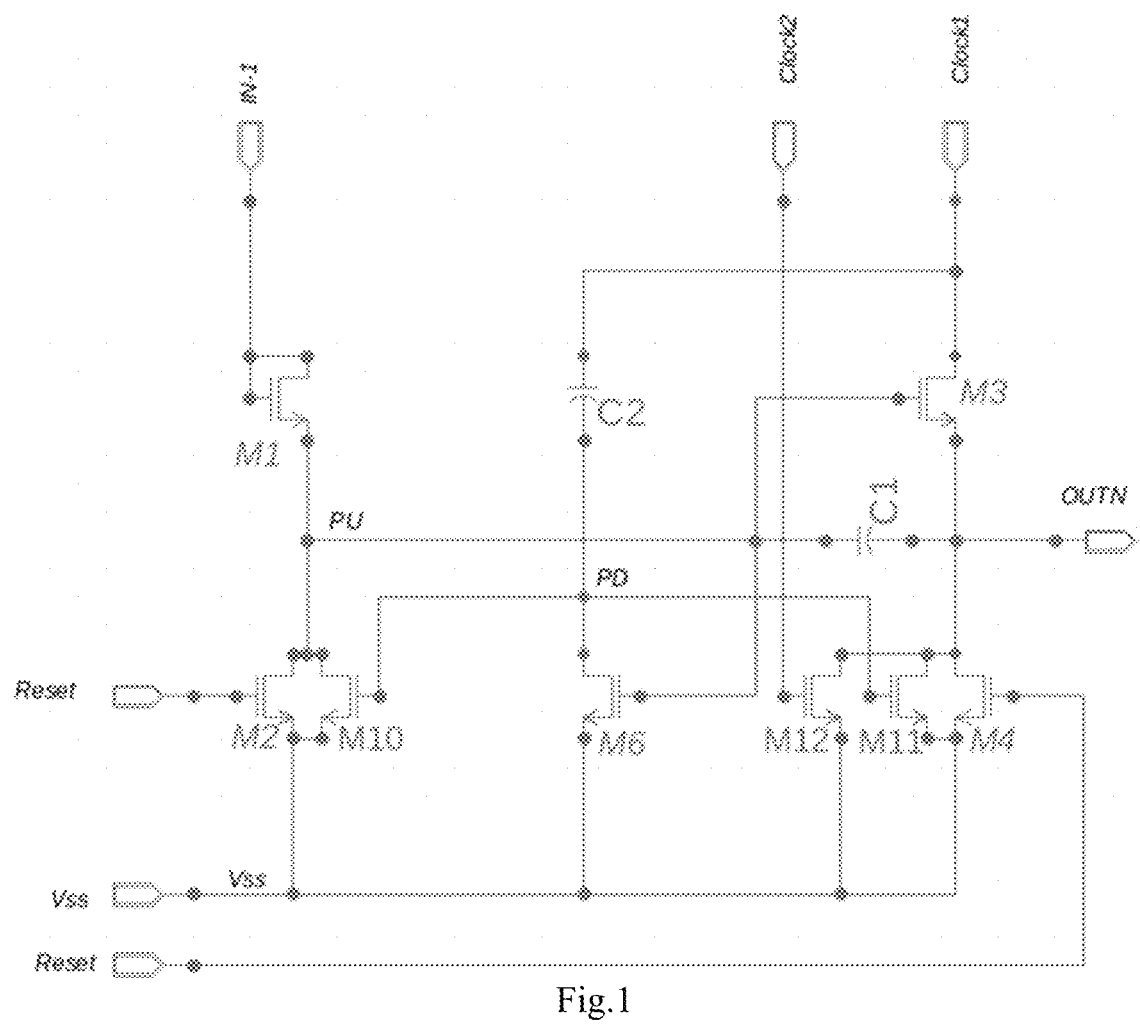
FIG. 1 shows a circuit diagram of a shift register unit.

Technical solutions in embodiments of the present disclosure will be described below by combining with figures in the embodiments of the present disclosure clearly and completely. Obviously, the embodiments described herein are just a part of embodiments of the present disclosure, but not all the embodiments. Based on the embodiments in the present disclosure, all the other embodiments obtained by those ordinary skilled in the art without paying any inventive labor belong to a scope sought for protection in the present disclosure.

"First", "second" and similar words used in the present disclosure do not indicate any sequence, quantity or importance, but they are only used to distinguish different components. Also, "include", "comprise" and similar words mean that an element or an object appearing prior to the word cover an element or an object and equivalents thereof appearing subsequent to the word, but does not exclude other elements or objects. "Connection", "connected" and similar words do not limit to any physical or mechanical connection, but can comprise electrical connection, regardless of direct or indirect connection.

Transistors adopted in all the embodiments of the present disclosure can be thin film transistors or field effect transistors or devices having the same characteristics. In the embodiments, connection manners of a drain and a source of each transistor can be exchanged with each other, and thus drains and sources of respective transistors in the embodiments of the present disclosure actually have no distinction. Herein, for the purpose of convenient description, one of the drain and the source of the transistor is called as a first electrode of the transistor, while another thereof is called as a second electrode of the transistor.

Since the GOA design has advantages of low cost, narrow framework, simple processing technology, it is widely studied and concerned in the display industry and is applied in a series of products in recent years. Since the basic principle of the operation of GOA is to progressively deliver to the next depending on a signal of a previous row, once a GOA driving unit of one row outputs a wrong signal, this wrong signal would be delivered to the next progressively, and there is a possibility of amplification of abnormal signals, thereby resulting in distortion of driving signals and causing abnormality of panel display. In the driving unit, when noise exists, it is very likely to cause display abnormality by amplifying signals progressively.

The GOA driving unit always adopts a pull-down transistor to realize the noise reduction function, and utilizes a pull-down node to control the turn-on state of the pull-down transistor, so as to discharge the signal output terminal. However, due to the influence of factors of parasitic capacitance and threshold voltage drift of transistors, the pull-down transistor can be turned on normally only if it is ensured that the pull-down node has an efficiently high valid pull-down level. The pull-down transistor cannot be turned on normally if a voltage of the pull-down node is lower than a valid pull-down level, i.e., failing to realize the noise reduction function of the driving unit, which is likely to result in display abnormality.

FIG. 1 shows a circuit diagram of a shift register unit. In the shift register unit, in order to realize the noise reduction function, pull-down transistors M10 and M11 are added, and turn-on/off of M10 and M11 is controlled by utilizing the pull-down node PD. For the pull-down node PD, the voltage of PD is pulled up under the effect of a Clock1 signal by adding a capacitor C2, so that the noise reduction function of the shift register unit is realized. Furthermore, when the pull-up node PU is at a high level, the pull-up node PU controls a transistor M6 to be turned on, so that the potential of the pull-down node PD is pulled down, thus guaranteeing the normal output of the signal output terminal.

However, in the shift register unit described above, due to parasitic capacitance existing in the transistors, the potential of the node PD can reach a valid pull-down level only if the capacitor C2 is large enough. Furthermore, when drift occurs to the threshold voltage of the transistors M10 and M11, it is likely that the voltage of the node PD cannot turn on the M10 and M11, such that the noise reduction function of the circuit cannot be realized. Therefore, in the shift register unit, C2 needs a large capacitor value to realize its noise reduction function, which means that it needs to occupy a large area, thereby limiting implementation of a narrow-framework product.

Figure 2:
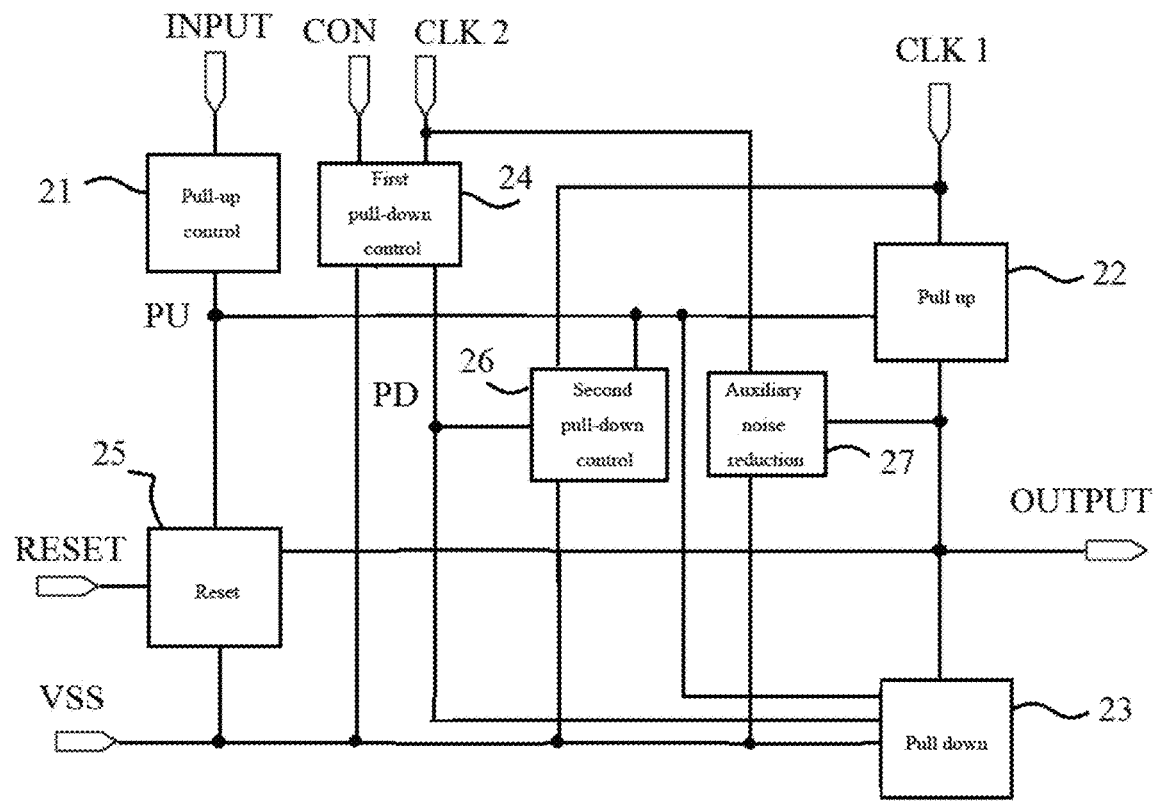
FIG. 2 shows a block diagram of a shift register unit according to some embodiments of the present disclosure.

There is provided in the present disclosure a shift register unit. FIG. 2 shows a block diagram of a shift register unit according to the embodiments of the present disclosure. As shown in FIG. 2, in some embodiments, the shift register unit 200 can comprise: a pull-up control circuit 21, a pull-up circuit 22, a pull-down circuit 23 and a first pull-down control circuit 24.

The pull-up control circuit 21 is connected to a signal input terminal INPUT and a pull-up node PU, and configured to output a voltage of the signal input terminal INPUT to the pull-up node PU when the pull-up node PU is at a valid input level.

The pull-up circuit 22 is connected to the pull-up node PU, a first clock signal terminal CLK1 and a signal output terminal OUTPUT, and configured to output a first clock signal of the first clock signal terminal CLK1 to the signal output terminal OUTPUT when the pull-up node PU is at a valid pull-up level.

The pull-down circuit 23 is connected to a pull-down node PD, the pull-up node PU, the signal output terminal OUTPUT and a power supply voltage terminal VSS, and configured to pull down voltages of the pull-up node PU and the signal output terminal OUTPUT to a voltage of the power supply voltage terminal VSS when the pull-down node PD is at a valid pull-down level.

The first pull-down control circuit 24 is connected to a second clock signal terminal CLK2, a pull-down control signal terminal CON, the pull-down node PD and the power supply voltage terminal VSS, and configured to pull up the voltage of the pull-down node PD to a valid pull-down level when the pull-down control signal terminal CON is at a valid pull-down control level.

As shown in FIG. 2, the shift register unit 200 according to the embodiments of the present disclosure can further comprise a second pull-down control circuit 26. The second pull-down control circuit 26 is connected to the first clock signal terminal CLK1, the pull-up node PU, the pull-down node PD and the power supply voltage terminal VSS, and configured to pull down the voltage of the pull-down node PD to the voltage of the power supply voltage terminal VSS when the pull-up node PU is at a valid pull-up level, and make the pull-down node PD in a valid pull-down level when the pull-up node PU is at an invalid pull-up level.

As shown in FIG. 2, the shift register unit 200 according to the embodiments of the present disclosure can further comprise an auxiliary noise reduction circuit 27. The auxiliary noise reduction circuit 27 is connected to the second clock signal terminal CLK2, the signal output terminal OUTPUT and the power supply voltage terminal VSS, and configured to pull down the voltage of the signal output terminal OUTPUT to the voltage of the power supply voltage terminal VSS when the second clock signal of the second clock signal terminal CLK2 is at a first level.

As shown in FIG. 2, the shift register unit 200 according to the embodiments of the present disclosure can further comprise a reset circuit 25. The reset circuit 25 is connected to the pull-up node PU, the signal output terminal OUTPUT, the power supply voltage terminal VSS and a reset signal terminal RESET, and configured to pull down voltages of the pull-up node PU and the signal output terminal OUTPUT to the voltage of the power supply voltage terminal VSS when the reset signal terminal RESET is at a valid reset level.

Herein, the power supply voltage terminal VSS is a low power supply voltage terminal.

In the embodiments, the first clock signal of the first clock signal terminal CLK1 and the second clock signal of the second clock signal terminal CLK2 have opposite phases.

Figure 3:
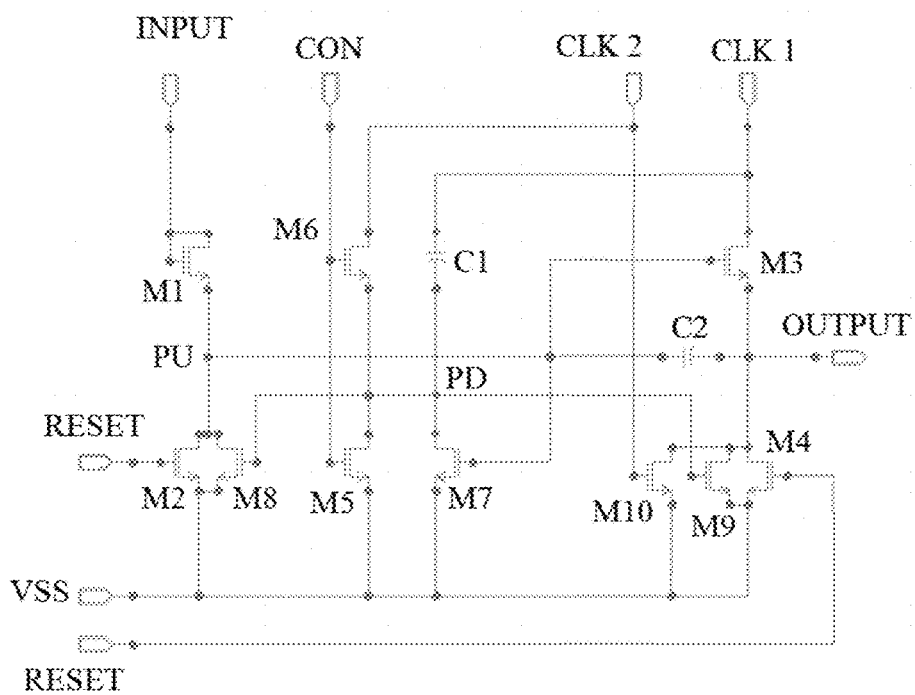
FIG. 3 shows an exemplary circuit structure diagram of a shift register unit according to some embodiments of the present disclosure.

FIG. 3 shows an exemplary circuit diagram of the shift register unit according to the embodiments of the present disclosure. As an example, the transistors as shown in FIG. 3 are N-type transistors. As well known by those skilled in the art, the N-type transistor is turned on when the gate is inputted a high level. Therefore, the valid input level, the valid pull-up level, the valid pull-down level, the valid pull-down control level, and the first level are the high level. It needs to note that the shift register unit 200 according to the embodiments of the present disclosure can also adopt the P-type transistor, or can adopt both the N-type transistor and the P-type transistor.

As shown in FIG. 3, for example, the first pull-down control circuit 24 can comprise a first pull-down control transistor M6 and a second pull-down control transistor M5. A gate of the first pull-down control transistor M6 is connected to a pull-down control signal terminal CON, a first electrode thereof is connected to the second clock signal terminal CLK2, and a second electrode thereof is connected to the pull-down node PD. A gate of the second pull-down control transistor M5 is connected to is connected to the pull-down control signal terminal CON, a first electrode thereof is connected to the pull-down node PD, and a second electrode thereof is connected to the power supply voltage terminal VSS. The transistors M5 and M6 are turned on when the voltage of the pull-down control signal terminal CON is a high level, so as to pull up the voltage of the pull-down node PD to a valid pull-down level.

According to the embodiments of the present disclosure, for example, when the transistors M5 and M6 are turned on, the voltage of the pull-down node PD can be controlled according to a channel width-to-length ratio of the first pull-down control transistor M6 and the second pull-down control transistor M5. For example, when the first pull-down control transistor M6 and the second pull-down control transistor M5 are in a turn-on state, voltage division performed by the transistors M5 and M6 on the voltage of the second clock signal terminal CLK2 can be realized by designing the channel width-to-length ratio of the M5 and M6, so that the pull-down node PD has an expected voltage value, and the expected voltage value is higher than the valid pull-down level of the pull-down node PD, thereby guaranteeing that the pull-down node PD controls the pull-down circuit 23 to realize the noise reduction function of the pull-up node PU and the signal output terminal OUTPUT in the shift register unit 200.

As shown in FIG. 3, for example, the second pull-down control circuit 26 can comprise a first capacitor C1 and a third pull-down transistor M7. The first capacitor C1 has two terminals, of which one terminal is connected to the first clock signal terminal CLK1, and another terminal is connected to the pull-down node PD. A gate of the third pull-down control transistor M7 is connected to the pull-up node PU, a first electrode thereof is connected to the pull-down node PD, and a second electrode thereof is connected to the power supply voltage terminal VSS. When the pull-up node PU is at the valid pull-up level, the third pull-down transistor M7 is turned on, so that the voltage of the pull-down node PD is pulled down to the voltage of the power supply voltage terminal VSS, and when the pull-up node PU is at the invalid pull-up level, the third pull-down transistor M7 is turned off, so that the pull-down node PD maintains at the valid pull-down level due to the effect of the first capacitor C1.

As shown in FIG. 3, for example, the auxiliary noise reduction circuit 27 can comprise an auxiliary noise reduction transistor M10, of which a gate is connected to the second clock signal terminal CLK2, a first electrode is connected to the signal output terminal OUTPUT, and a second electrode is connected to the power supply voltage terminal VSS. When the second clock signal of the second clock signal terminal CLK2 is at a high level, the auxiliary noise reduction transistor M10 is turned on, so that the voltage of the signal output terminal OUTPUT is pulled down to the voltage of the power supply voltage terminal VSS, thereby guaranteeing that there is no valid signal outputted in this phase. Since the phase of the second clock signal is opposite to that of the first clock signal, the second clock signal is a high level while the first clock signal is at a low level. That is, the auxiliary noise reduction circuit 27 avoids the signal output terminal OUTPUT from outputting the gate driving signal when the first clock signal is at a low level.

As shown in FIG. 3, for example, the reset circuit 25 can comprise a first reset transistor M2 and a second reset transistor M4. A gate of the first reset transistor M2 is connected to a reset signal terminal RESET, a first electrode thereof is connected to the pull-up node PU, and a second electrode thereof is connected to the power supply voltage terminal VSS. A gate of the second reset transistor M4 is connected to the reset signal terminal RESET, a first electrode thereof is connected to the signal output terminal OUTPUT, and a second electrode thereof is connected to the power supply voltage terminal VSS. When the reset signal terminal RESET is at a high level, the first reset transistor M2 and the second reset transistor M4 are turned on, so that the voltages of the pull-up node PU and the signal output terminal OUTPUT are pulled down to the voltage of the power supply voltage terminal VSS.

As shown in FIG. 3, for example, the pull-up control circuit 21 can comprise a pull-up control transistor M1. A gate and a first electrode of the pull-up control transistor M1 are connected to the signal input terminal INPUT, and a second electrode thereof is connected to the pull-up node PU. When the input signal of the signal input terminal INPUT is at a high level, the pull-up control transistor M1 is turned on, to output the input signal of the signal input terminal INPUT to the pull-up node PU.

As shown in FIG. 3, for example, the pull-up circuit 22 can comprise a pull-up transistor M3 and a second capacitor C2. A gate of the pull-up transistor M3 is connected to the pull-up node PU, a first electrode thereof is connected to the first clock signal terminal CLK1, and a second electrode thereof is connected to the signal output terminal OUTPUT. The second capacitor C2 comprises two terminals, of which one terminal is connected to the pull-up node PU, and another terminal is connected to the signal output terminal OUTPUT. When the pull-up node PU is at a high level, the pull-up transistor M3 is turned on, to output the first clock signal of the first clock signal terminal CLK1 to the signal output terminal OUTPUT.

As shown in FIG. 3, for example, the pull-down circuit 23 can comprise a first pull-down transistor M8 and a second pull-down transistor M9. A gate of the first pull-down transistor M8 is connected to the pull-down node PD, a first electrode thereof is connected to the pull-up node PU, and a second electrode thereof is connected to the power supply voltage terminal VSS. A gate of the second pull-down transistor M9 is connected to the pull-down node PD, a first electrode thereof is connected to the signal output terminal OUTPUT, and a second electrode thereof is connected to the power supply voltage terminal VSS. When the pull-down node PD is at a high level, the first pull-down transistor M8 and the second pull-down transistor M9 are turned on, so as to pull down the voltages of the pull-up node PU and the signal output terminal OUTPUT to the voltage of the power supply voltage terminal VSS.

According to the embodiments of the present disclosure, the first pull-down control circuit in the shift register unit can realize pulling up the level of the pull-down node PD when the voltage of the pull-down control signal terminal CON is at the valid pull-down control level, so that the pull-down node is at the valid pull-down level, thereby guaranteeing the normal turn-on of the first and second pull-down transistors M8 and M9, so as to complete the pull-down noise reduction function of the pull-up node PU and the signal output terminal OUTPUT. Herein, the pull-down control signal terminal CON and the reset signal terminal RESET in the shift register unit can be implemented as a same terminal. Generally speaking, in the driving circuit composed of a plurality of shift register units, the reset signal terminal can be connected to a signal output terminal OUTPUT N+1 of a next stage shift register unit adjacent to the present stage shift register unit. That is, the pull-down control signal terminal CON of the shift register unit according to the embodiments of the present disclosure can also be connected to the signal output terminal OUTPUT N+1. It needs to note that it is just one kind of implementation of the pull-down control signal terminal CON. In other embodiments according to the present disclosure, the controlling function of the pull-down control signal terminal CON can also be implemented in other ways.

Figure 4:
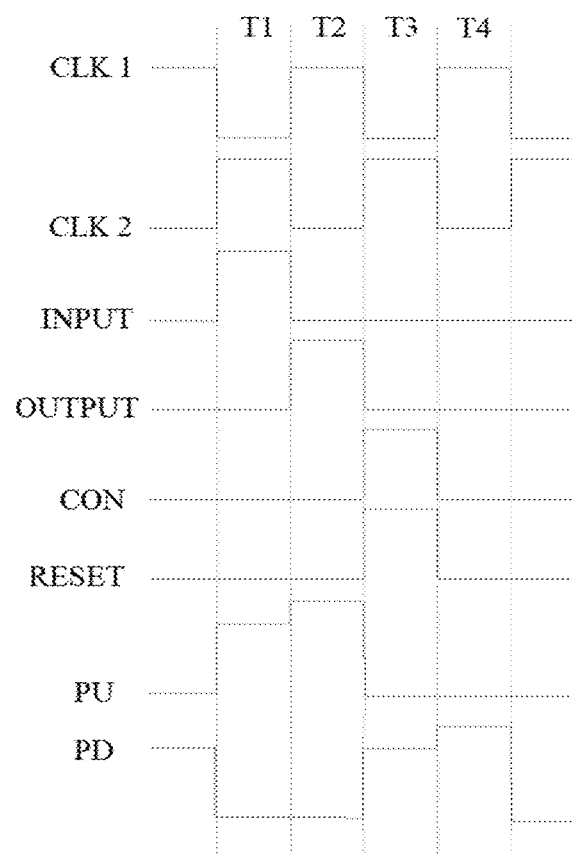
FIG. 4 shows an operation timing diagram of an exemplary circuit of the shift register unit in FIG. 3.

FIG. 4 shows an operation timing diagram of an exemplary circuit of the shift register unit 200 in FIG. 3. The driving method of the shift register unit in FIG. 3 will be described below by combining with FIGS. 3 and 4.

In a first phase T1, the signal input terminal INPUT is at a high level, and the pull-up control transistor M1 is turned on, to output the high level of the signal input terminal INPUT to the pull-up node PU. At this time, the pull-up node PU is at a high level, so that the pull-up transistor M3 is turned on. Since the first clock signal of the first clock signal terminal CLK1 is at a low level, the signal output terminal OUTPUT outputs a low level. Since the pull-up node PU is at a high level, the third pull-down control transistor M7 is turned on, to pull down the voltage of the pull-down node PD to the low level of the power supply voltage terminal VSS. Correspondingly, the first pull-down transistor M8, and the second pull-down transistor M9 are turned off. In this phase, the second clock signal terminal CLK2 is at a high level, the auxiliary noise reduction transistor M10 is turned on, so as to pull down the voltage of the signal output terminal OUTPUT to the low level of the power supply voltage terminal VSS. In this phase, the reset signal of the reset signal terminal RESET is at a low level, so that the first reset transistor M2 and the second reset transistor M4 are turned off. In addition, in this phase, since the pull-down control signal terminal CON is at a low level, both the first pull-down control transistor M6 and the second pull-down control transistor M5 are turned off.

In a second phase T2, the signal input terminal INPUT is at a low level, and the pull-up control transistor M1 is turned off. At this time, since the pull-up node PU is already at a high level, the pull-up transistor M3 is continuously turned on. Furthermore, the first clock signal of the first clock signal terminal CLK1 is at a high level in this phase, so that the signal output terminal OUTPUT outputs a high level. Due to the coupling effect of the second capacitor C2, as the voltage of the signal output terminal OUTPUT rises, the voltage of the pull-up node PU further rises. In addition, in this phase, since the pull-up node PU is still at a high level, the third pull-down control transistor M7 is continuously turned on, then the voltage of the pull-down node PD maintains at a low level. Correspondingly, the first pull-down transistor M8 and the second pull-down transistor M9 maintain turned off. In this phase, the second clock signal terminal CLK2 is at a low level, the auxiliary noise reduction transistor M10 is turned off. In this phase, the reset signal of the reset signal terminal RESET is still at a low level, and thus the first reset transistor M2 and the second reset transistor M4 maintain turned off. In addition, in this phase, since the pull-down control signal terminal CLM is still at a low level, both the first pull-down control transistor M6 and the second pull-down control transistor M5 maintain turned off.

In a third phase T3, the signal input terminal INPUT is at a low level, and the pull-up control transistor M1 maintains turned off. On one hand, the reset signal of the reset signal terminal RESET is at a high level, so that the first reset transistor M2 and the second reset transistor M4 are turned on, to pull down the pull-up signal of the pull-up node PU and the output signal of the signal output terminal OUTPUT to the low level of the power supply voltage terminal VSS. Correspondingly, the pull-up transistor M3 and the third pull-down control transistor M7 are turned off. On the other hand, since the second clock signal terminal CLK2 is at a high level, the auxiliary noise reduction transistor M10 is turned on, to further pull down the voltage of the signal output terminal OUTPUT to the low level of the power supply voltage terminal VSS. In addition, in this phase, the pull-down control signal terminal CON is at a high level, so that both the first pull-down control transistor M6 and the second pull-down control transistor M5 are turned on. Furthermore, at this time, the second clock signal terminal CLK2 is at a high level, the pull-down node connected to the first electrode of the transistor M5 and the second electrode of the transistor M6 is at a valid pull-down level due to the effect of voltage division of M5 and M6. For example, the voltage of the pull-down node PD can be controlled by designing the channel width-to-length ratio of the transistors M5 and M6. For example, if the voltage of the second clock signal terminal CLK2 is 20V, the valid pull-down level of the pull-down node PD is 8V, then the channel width-to-length ratio of the transistors M5 and M6 is 1:1. Under the effect of voltage division, the voltage of the pull-down node PD is 10V, so as to ensure that the pull-down node PD is capable of making the pull-down transistors M8 and M9 turned on efficiently.

In a fourth phase T4, the signal input terminal INPUT is at a low level, the pull-up control transistor M1 maintains turned off, and the pull-up node PU maintains at a low level. Correspondingly, the pull-up transistor M3 and the third pull-down control transistor M7 maintain turned off. The second clock signal terminal CLK2 is at a low level, and the auxiliary noise reduction transistor M10 is turned off. In this phase, the reset signal terminal RESET is at a low level, so that the first reset transistor M2 and the second reset transistor M4 are turned off. In this phase, the pull-down control signal terminal CON is at a low level, so that the first pull-down control transistor M6 and the second pull-down control transistor M5 are turned off. In addition, in this phase, the first clock signal terminal CLK1 is at a high level. Since the first pull-down control circuit 24 has pulled up the voltage of the pull-down node PD to the valid pull-down level in the phase T3, the pull-down node PD maintains the valid pull-down level. Furthermore, the voltage of the pull-down node PD rises due to the maintenance effect of the first capacitor C1. Correspondingly, the first pull-down transistor M8 and the second pull-down transistor M9 are turned on, to pull down the voltages of the pull-up node PU and the signal output terminal OUTPUT to the low level of the power supply voltage terminal VSS, so as to guarantee the noise reduction function of the PU and OUTPUT, and avoid outputting a wrong gate signal.

After that, before a next frame comes, the second clock signal terminal CLK2 would maintain the voltage of the pull-down node PD at a valid pull-down voltage via the first capacitor C1, to constantly pull down the voltages of the PU and OUTPUT, and thus continuously realize the noise reduction function of the PU and OUTPUT. Thus it can be known that in the shift register unit 200 according to the embodiments of the present disclosure, the valid pull-down level of the pull-down node PD is guaranteed through the first pull-down control circuit 24. Even if the value of the capacitor C1 is smaller, it can also ensure sustainable implementation of the noise reduction function of the PU and OUTPUT. Thus, it is capable of ensuring stability of the output of the shift register unit 200 according to the embodiments of the present disclosure, prolonging the service life of the display produce that applies this shift register unit 200, and improving the display effect of the display apparatus. In addition, the design of a smaller first capacitor C1 is advantageous for compressing the space of the driving circuit of the display panel and realizing the requirement for designing a narrow-framework display product.

According to the embodiments of the present disclosure, there is provided the shift register unit, comprising the pull-up control circuit, the pull-up circuit, the first pull-up control circuit, and the pull-down circuit, of which when the voltage of the pull-down control signal terminal is at a valid level, the first pull-down control circuit pulls up the voltage of the pull-down node to the valid pull-down level, so that the normal turn-on of the pull-down transistor is guaranteed, the stable noise reduction function of the shift register unit is realized, and the phenomenon of display abnormity is avoided.

Figure 5:
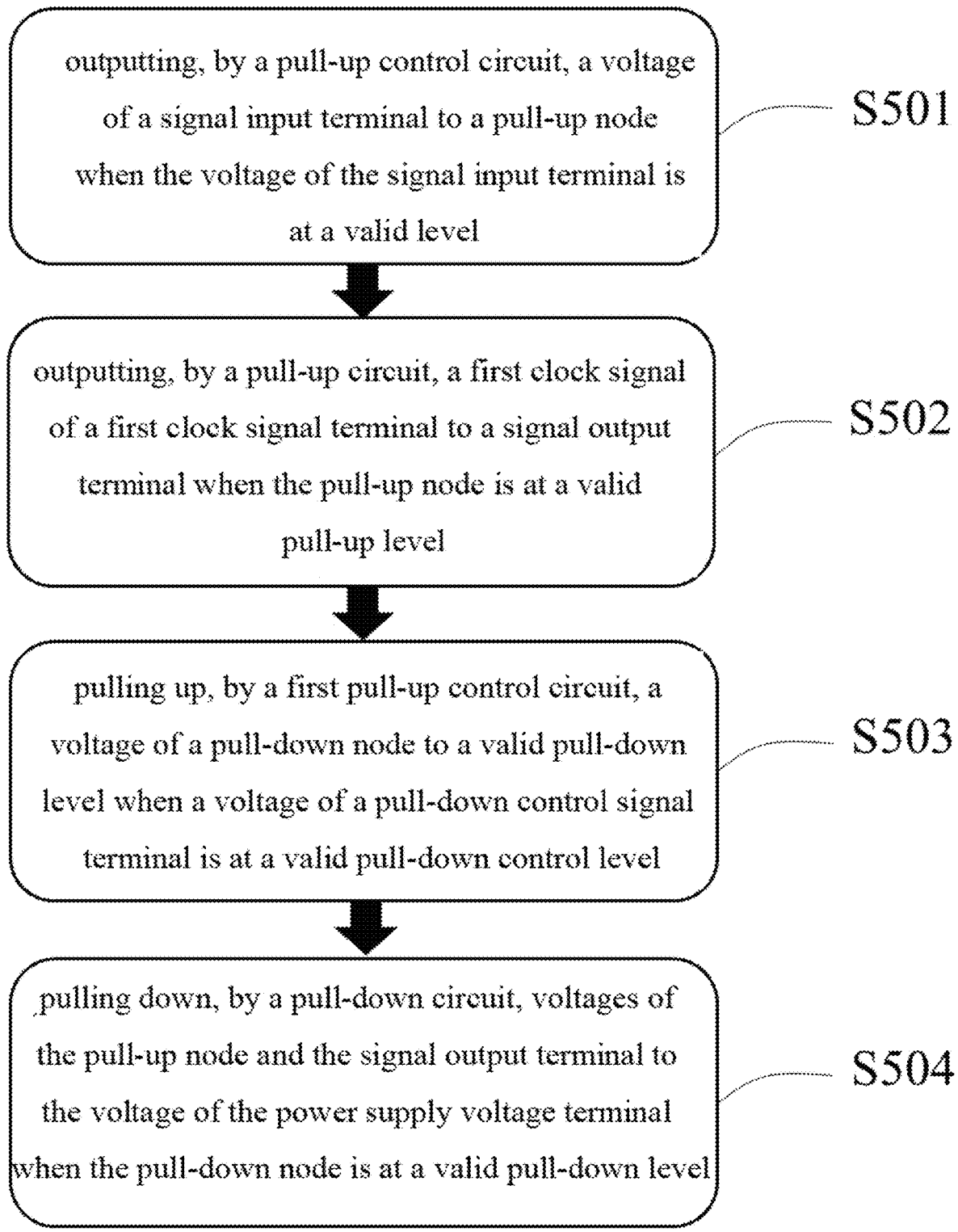
FIG. 5 shows an exemplary driving method of a shift register unit according to some embodiments of the present disclosure.

There is further provided in the present disclosure a driving method of the shift register unit as described above. FIG. 5 shows an exemplary driving method of the shift register unit according to the embodiments of the present disclosure. This method will be described below by referring to FIG. 5 and combining with FIGS. 2 and 4. In some embodiments, for example, as shown in FIG. 2, the shift register unit 200 can comprise a pull-up control circuit 21, a pull-up circuit 22, a pull-down circuit 23 and a first pull-down control circuit 24.

In the driving method according to the embodiments of the present disclosure, in step S501, when the voltage of the signal input terminal INPUT is at a valid input level, the pull-up control circuit 21 receives the input signal of the signal input terminal INPUT and outputs the input signal to the pull-up node PU.

Next, in step S502, when the pull-up node PU is at a valid pull-up level, the pull-up circuit 22 outputs the first clock signal of the first clock signal terminal CLK1 to the signal output terminal OUTPUT.

Next, in step S503, when the voltage of the pull-down control signal terminal CON is at a valid pull-down control level, the first pull-down control circuit 24 pulls up the voltage of the pull-down node PD to the valid pull-down level.

Next, in step S504, when the pull-down node PD is at a valid pull-down level, the pull-down circuit 23 pulls down the voltages of the pull-up node PU and the signal output terminal OUTPUT to the voltage of the power supply voltage terminal VSS.

Herein, the power supply voltage terminal VSS is a low power supply voltage terminal, and the first clock signal of the first clock signal terminal CLK1 and the second clock signal of the second clock signal terminal CLK2 have opposite phases.

The first pull-down control circuit 24 can comprise a first pull-down control transistor M6 and a second pull-down control transistor M5. A gate of the first pull-down control transistor M6 is connected to the pull-down control signal terminal CON, a first electrode thereof is connected to the second clock signal terminal CLK2, and a second electrode thereof is connected to the pull-down node PD. A gate of the second pull-down control transistor M5 is connected to the pull-down control signal terminal CON, a first electrode thereof is connected to the pull-down node PD, and a second electrode thereof is connected to the power supply voltage terminal VSS.

In the driving method according to the embodiments of the present disclosure, in step S503, the voltage of the pull-down node PD can be controlled according to the channel width-to-length ratio of the first pull-down control transistor M6 and the second pull-down control transistor M5.

The shift register unit 200 can further comprise a second pull-down control circuit 26. In steps S501 and S502, the driving method further comprises: when the pull-up node PU is at a valid pull-up level, the second pull-down control circuit 26 pulls down the voltage of the pull-down node PD to the voltage of the power supply voltage terminal VSS; when the pull-up node PU is at an invalid pull-up level, the second pull-down control circuit 26 makes pull-down node PD in a valid pull-down level.

Herein, the second pull-down control circuit 26 can comprise a first capacitor C1 and a third pull-down control transistor M7. The first capacitor C1 comprises two terminals, of which one terminal is connected to the first clock signal terminal CLK1, and another terminal is connected to the pull-down node PD. A gate of the third pull-down control transistor M7 is connected to the pull-up node PU, a first electrode thereof is connected to the pull-down node PD, and a second electrode thereof is connected to the power supply voltage terminal VSS.

The shift register unit 200 can further comprise an auxiliary noise reduction circuit 27. In steps S501 and S503, the driving method further comprises: when the second clock signal of the second clock signal terminal CLK2 is at a first level, the auxiliary noise reduction circuit 27 pulls down the voltage of the signal output terminal OUTPUT to the voltage of the power supply voltage terminal VSS.

The shift register unit 200 can further comprise a reset circuit 25. In step S503, the driving method further comprises: when the voltage of the reset signal terminal RESET is at a valid reset level, the reset circuit 25 pulls down the voltages of the pull-up node PU and the signal output terminal OUTPUT to the voltage of the power supply voltage terminal VSS.

In the shift register unit and its driving method according to the embodiments of the present disclosure, the first pull-down control transistor M6 and the second pull-down control transistor M5 in the first pull-down control circuit 24 are turned on when the pull-down control signal terminal CON is at a valid pull-down control level, and the transistors M6 and M5 perform voltage division on the second clock signal of the second clock signal terminal CLK2, so that the pull-down node PD is at a valid pull-down level, so as to realize the noise reduction function of the pull-up node PU and the signal output terminal OUTPUT. In addition, since the first pull-down control circuit 24 pulls down the pull-down node PD to the valid pull-down level in phase T3, so that in phase T4, the first capacitor C1 of the second pull-down control circuit 26 can constantly pull up the voltage of the pull-down node PD, which guarantees a stable signal output of the signal output terminal OUTPUT, and improves quality of displaying. On such a basis, compared with the shift register unit as shown in FIG. 1, the first capacitor C1 does not need a relatively large capacitance value, which is more beneficial to the requirement for designing a narrower-framework display product.

Figure 6:
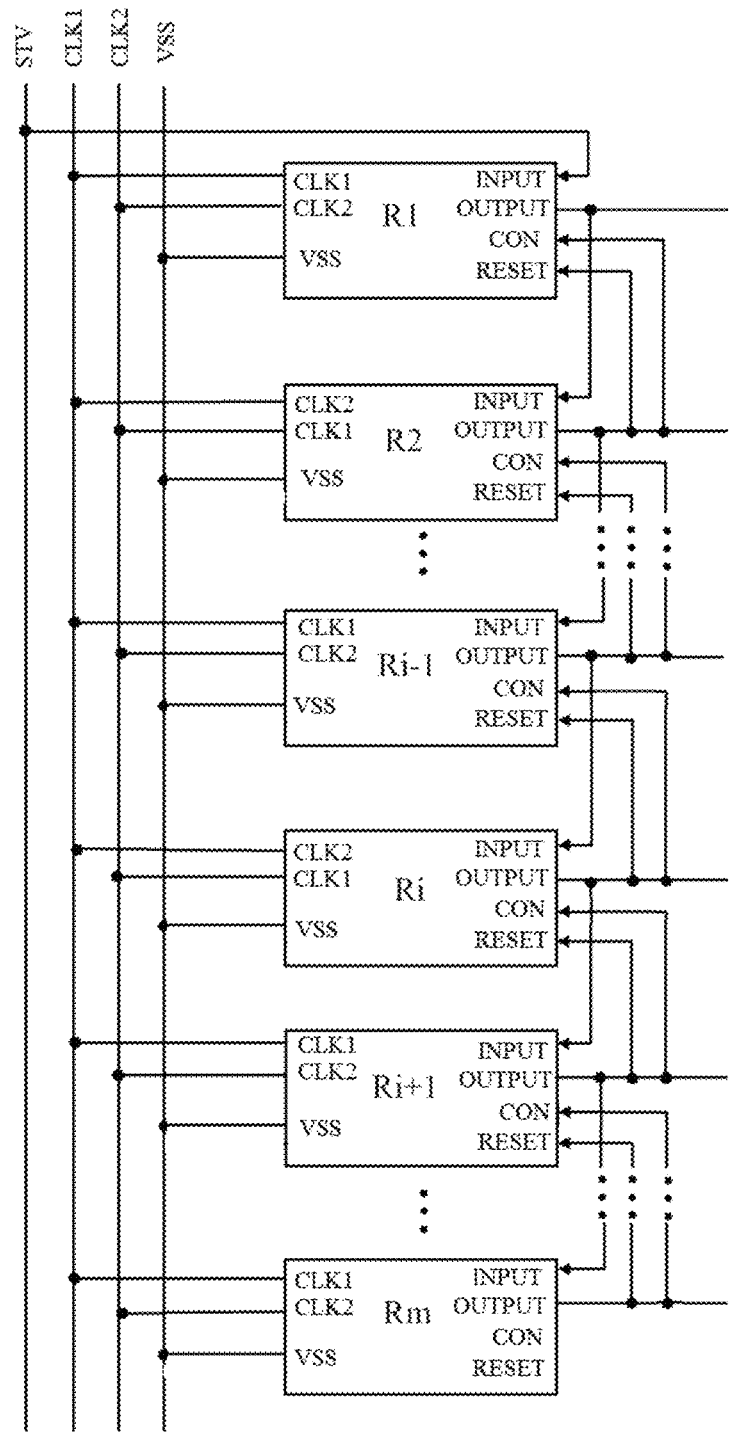
FIG. 6 shows a schematic diagram of a gate driving apparatus formed by a plurality of shift register units connected in cascades according to some embodiments of the present disclosure.

FIG. 6 shows a schematic diagram of a gate driving apparatus formed by a plurality of shift register units connected in cascades according to the embodiments of the present disclosure.

As shown in FIG. 6, the gate driving apparatus comprises a plurality stages of shift register units as shown in FIG. 3, of which except for a last stage shift register unit, a signal output terminal OUTPUT of each stage shift register unit is connected to a signal input terminal INPUT of a next stage shift register unit adjacent thereto, and a signal input terminal INPUT of a first stage shift register unit is inputted a frame start signal STV.

As shown in FIG. 6, in the gate driving apparatus according to the present disclosure, the signal input terminal INPUT of the shift register unit can be implemented as being connected to a signal output terminal OUTPUT N−1 of a previous stage shift register unit adjacent to the shift register unit. The pull-up control signal terminal CON can be implemented as being connected to a signal output terminal OUTPUT N+1 of a next stage shift register unit adjacent to the shift register unit.

As shown in FIG. 6, in the gate driving apparatus, clock signals inputted to the clock signal terminals of two adjacent stages of shift register units are opposite. For example, if an i-th stage shift register unit Ri is inputted a clock signal CLK1, then an (i+1)-th stage shift register unit Ri+1 is inputted a clock signal CLK2, of which the signals CLK1 and CLK2 have opposite phases.

When the gate driving apparatus according to the embodiments of the present disclosure performs scanning, specific operation processes of respective shift register units are similar to the operation processes described by referring to FIGS. 3 and 4, and thus no further details are given herein.

The gate driving apparatus according to the embodiments of the present disclosure can adopt the GOA technique to be used as a gate driving circuit of a display apparatus, in order to provide a progressive scanning function and deliver the scanning signal to the display area.

The present disclosure further provides a display apparatus comprising the gate driving apparatus as described above. The display apparatus herein can be any product or means having the function of displaying such as an electronic paper, a mobile phone, a tablet computer, a television set, a display, a notebook display, a digital framework, a navigator, etc.

There are provided in the present disclosure the shift register unit and its driving method, the driving apparatus and the display apparatus. The shift register unit comprises the pull-up control circuit, the pull-up circuit, the first pull-down control circuit, and the pull-down circuit. The first pull-down control circuit is configured to pull up the voltage of the pull-down node to the valid pull-down level when the pull-down control signal terminal is at the valid pull-down control level, of which the first pull-down control circuit can comprise a first pull-down control transistor and a second pull-down control transistor. When the first pull-down control transistor and the second pull-down control transistor are turned on under the control of the pull-down control signal terminal, voltage division is implemented by designing a channel width-to-length ratio between the first pull-down control transistor and the second pull-down control transistor, so as to the voltage of the pull-down node is pulled up to the valid pull-down level, so that the noise reduction function of the shift register unit is realized, the stable signal output of the gate driving circuit is guaranteed, and the display quality is improved.

In addition, the shift register unit can further comprise the second pull-down control circuit. The second pull-down control circuit comprises the first capacitor and the third pull-down control transistor. When the pull-down node is at the valid pull-up level and the first clock signal terminal is at the first level, the voltage of the pull-down node is constantly pulled up, so as to further guarantee that the pull-down node is at the valid pull-down level. In this way, compared with the shift register unit as shown in FIG. 1, the capacitance value of the first capacitor in the second pull-down control circuit may be smaller, and it can also guarantee constant implementation of the noise reduction function of the pull-up node and the signal output terminal. Thus, it is capable of guaranteeing the output stability of the shift register unit according to the embodiments of the present disclosure, prolonging the service lifetime of the display product that applies the shift register unit, and improving the display effect of the display apparatus. In addition, the design for a smaller first capacitor is advantageous for compressing the space of the driving circuit of the display panel, thereby realizing the requirement for designing the narrower-framework display product.

The above descriptions are descriptions of the present invention, but shall not be deemed as a limitation thereto, although several exemplary embodiments of the present disclosure are described, it is easy for those skilled in the art to understand that many amendments can be made to exemplary embodiments without departing from the novel teachings and advantages of the present disclosure. Therefore, all these amendments intend to be included within the scope of the present disclosure as defined in the Claims. It shall be understood that the above are descriptions of the present disclosure, but shall not be deemed as being limited to the specific embodiments as disclosed. Furthermore, the amendments made to the embodiments and other embodiments of the present disclosure shall be included within the scope of the Claims. The present disclosure is defined by the Claims and equivalents thereof.

What is claimed is:

1. A shift register unit, comprising:
   a pull-up control circuit, connected to a signal input terminal and a pull-up node, and configured to output a voltage of the signal input terminal to the pull-up node under the control of the signal input terminal;
   a pull-up circuit, connected to the pull-up node, a first clock signal terminal, and a signal output terminal, and configured to output a first clock signal of the first clock signal terminal to the signal output terminal under the control of the pull-up node;

a pull-down circuit, connected to a pull-down node, the pull-up node, the signal output terminal, and a power supply voltage terminal, and configured to pull down voltages of the pull-up node and the signal output terminal to a voltage of the power supply voltage terminal under the control of the pull-down node; and a first pull-down control circuit, connected to a second clock signal terminal, a pull-down control signal terminal, the pull-down node, and the power supply voltage terminal, and configured to pull up the voltage of the pull-down node to a valid pull-down level under the control of the pull-down control signal terminal, wherein the first pull-down control circuit includes:

a first pull-down control transistor, of which a gate is connected to the pull-down control signal terminal, a first electrode is connected to the second clock signal terminal, and a second electrode is connected to the pull-down node, and a second pull-down control transistor, of which a gate is connected to the pull-down control signal terminal, a first electrode is connected to the pull-down node, and a second electrode is connected to the power supply voltage terminal.

2. The shift register unit according to claim 1, wherein the voltage of the pull-down node is controlled according to a channel width-to-length ratio of the first pull-down control transistor and the second pull-down control transistor.

3. The shift register unit according to claim 1, further including a second pull-down control circuit, connected to the first clock signal terminal, the pull-up node, the pull-down node, and the power supply voltage terminal, and configured to pull down the voltage of the pull-down node to the voltage of the power supply voltage terminal when the pull-up node is at a valid pull-up level, and make the pull-down node be at a valid pull-down level when the pull-up node is at an invalid pull-up level.

4. The shift register unit according to claim 3, wherein the second pull-down control circuit includes:

a first capacitor, of which one terminal is connected to the first clock signal terminal, and another terminal is connected to the pull-down node;

a third pull-down control transistor, of which a gate is connected to the pull-up node, a first electrode is connected to the pull-down node, and a second electrode is connected to the power supply voltage terminal.

5. The shift register unit according to claim 1, further including an auxiliary noise reduction circuit, connected to the second clock signal terminal, the signal output terminal, and the power supply voltage terminal, and configured to pull down the voltage of the signal output terminal to the voltage of the power supply voltage terminal under the control of the second clock signal terminal.

6. The shift register unit according to claim 5, wherein the auxiliary noise reduction circuit includes:

an auxiliary noise reduction transistor, of which a gate is connected to the second clock signal terminal, a first electrode is connected to the signal output terminal, and a second electrode is connected to the power supply voltage terminal.

7. The shift register unit according to claim 1, further including: a reset circuit, connected to the pull-up node, the signal output terminal, the power supply voltage terminal, and a reset signal terminal, and configured to pull down voltages of the pull-up node and the signal output terminal to the voltage of the power supply voltage terminal under the control of the reset signal terminal.

8. The shift register unit according to claim 7, wherein the reset circuit includes:

a first reset transistor, of which a gate is connected to the reset signal terminal, a first electrode is connected to the pull-up node, and a second electrode is connected to the power supply voltage terminal; and a second reset transistor, of which a gate is connected to the reset signal terminal, a first electrode is connected to the signal output terminal, and a second electrode is connected to the power supply voltage terminal.

9. The shift register unit according to claim 1, wherein, the pull-up control circuit includes:

a pull-up control transistor, of which a gate and a first electrode are connected to the signal input terminal, and a second electrode is connected to the pull-up node, the pull-up circuit includes:

a pull-up transistor, of which a gate is connected to the pull-up node, a first electrode is connected to the first clock signal terminal, and a second electrode is connected to the signal output terminal, and a second capacitor, of which one terminal is connected to the pull-up node, and another terminal is connected to the signal output terminal, and the pull-down circuit includes:

a first pull-down transistor, of which a gate is connected to the pull-down node, a first electrode is connected to the pull-up node, and a second electrode is connected to the power supply voltage terminal, and a second pull-down transistor, of which a gate is connected to the pull-down node, a first electrode is connected to the signal output terminal, and a second electrode is connected to the power supply voltage terminal.

10. The shift register unit according to claim 1, wherein the first clock signal of the first clock signal terminal and a second clock signal of the second clock signal terminal have opposite phases.

11. A driving method of the shift register unit according to claim 1, including:

outputting, by the pull-up control circuit, the voltage of the signal input terminal to the pull-up node when the voltage of the signal input terminal is at a valid level;

outputting, by the pull-up circuit, the first clock signal of the first clock signal terminal to the signal output terminal when the pull-up node is at a valid pull-up level;

pulling up, by the first pull-down control circuit, the voltage of the pull-down node to a valid pull-down level when the voltage of the pull-down control signal terminal is at a valid pull-down control level; and pulling down, by the pull-down circuit, the voltages of the pull-up node and the signal output terminal to the voltage of the power supply voltage terminal when the pull-down node is at a valid pull-down level.

12. The driving method according to claim 11, wherein the voltage of the pull-down node is controlled according to a channel width-to-length ratio of the first pull-down control transistor and the second pull-down control transistor.

13. The driving method according to claim 11, further including:

pulling down, by a second pull-down control circuit, the voltage of the pull-down node to the voltage of the power supply voltage terminal when the pull-up node is at a valid pull-up level; and making, by the second pull-down control circuit, the pull-down node be in a valid pull-down level when the pull-up node is at an invalid pull-up level.

14. The driving method according to claim 13, wherein the second pull-down control circuit includes:
   a first capacitor, of which one terminal is connected to the first clock signal terminal, and another terminal is connected to the pull-down node; and
   a third pull-down control transistor, of which a gate is connected to the pull-up node, a first electrode is connected to the pull-down node, and a second electrode is connected to the power supply voltage terminal.

15. The driving method according to claim 11, further including:
   pulling down, by an auxiliary noise reduction circuit, the voltage of the signal output terminal to the voltage of the power supply voltage terminal when a second clock signal of the second clock signal terminal is at a first level, wherein the first clock signal of the first clock signal terminal and the second clock signal of the second clock signal terminal have opposite phases.

16. The driving method according to claim 11, further including:
   pulling down, by a reset circuit, voltages of the pull-up node and the signal output terminal to the voltage of the power supply voltage terminal when the voltage of a reset signal terminal is at a valid reset level.

17. A gate driving apparatus, including a plurality of stages of shift register units connected in cascades, each stage shift register unit of the plurality of stages of shift register units is the shift register according to claim 1, wherein except for a last stage shift register unit, an output terminal of each stage shift register unit is connected to a signal input terminal of a next stage shift register unit adjacent thereto, and
   a signal input terminal of a first stage shift register unit is inputted a frame start signal.

18. A display apparatus including the gate driving apparatus according to claim 17.

* * * * *